United States Patent [19]

Sasaki et al.

[11] Patent Number: 5,533,664
[45] Date of Patent: Jul. 9, 1996

[54] METHOD OF MANUFACTURING A SEMICONDUCTOR DEVICE

[75] Inventors: Mamoru Sasaki; Chiaki Takubo, both of Yokohama; Yoichi Hiruta, Kashiwa, all of Japan

[73] Assignee: Kabushiki Kaisha Toshiba, Kawasaki, Japan

[21] Appl. No.: 301,014

[22] Filed: Sep. 6, 1994

[30] Foreign Application Priority Data

Sep. 7, 1993 [JP] Japan ................................ 5-221606

[51] Int. Cl.$^6$ ..................................... B23K 31/02
[52] U.S. Cl. ...................... 228/180.1; 228/245; 228/254
[58] Field of Search ............................... 228/180.1, 253, 228/254, 258, 245, 180.22

[56] References Cited

U.S. PATENT DOCUMENTS

| 3,187,242 | 6/1965 | Schick | 228/254 |
| 3,750,252 | 8/1973 | Landman | 228/180.21 |
| 4,402,450 | 9/1983 | Abraham et al. | 228/180.22 |

FOREIGN PATENT DOCUMENTS

| 60-241228 | 5/1984 | Japan . |
| 62-202532 | 9/1987 | Japan . |
| 63-110740 | 5/1988 | Japan . |

Primary Examiner—P. Austin Bradley
Assistant Examiner—Jeffrey T. Knapp
Attorney, Agent, or Firm—Finnegan, Henderson, Farabow, Garrett & Dunner

[57] ABSTRACT

In bonding the connecting electrodes of adjacent semiconductor chips to each other, a solder layer shaped like a bump is formed on that portion of the connecting electrode which is positioned on the upper surface of the semiconductor chip. The semiconductor chips are positioned close to each other such that the connecting electrodes of these chips are aligned with each other. Then, the solder layer is melted to cause the molten solder to flow along the entire region of the connecting electrode and, thus, to achieve mutual bonding of the connecting electrodes in the entire regions including the upper surface region and the side surface region. The method permits stably bonding semiconductor chips to each other with a high bonding strength, leading to an improved reliability of electric connection in the bonded portion.

11 Claims, 7 Drawing Sheets

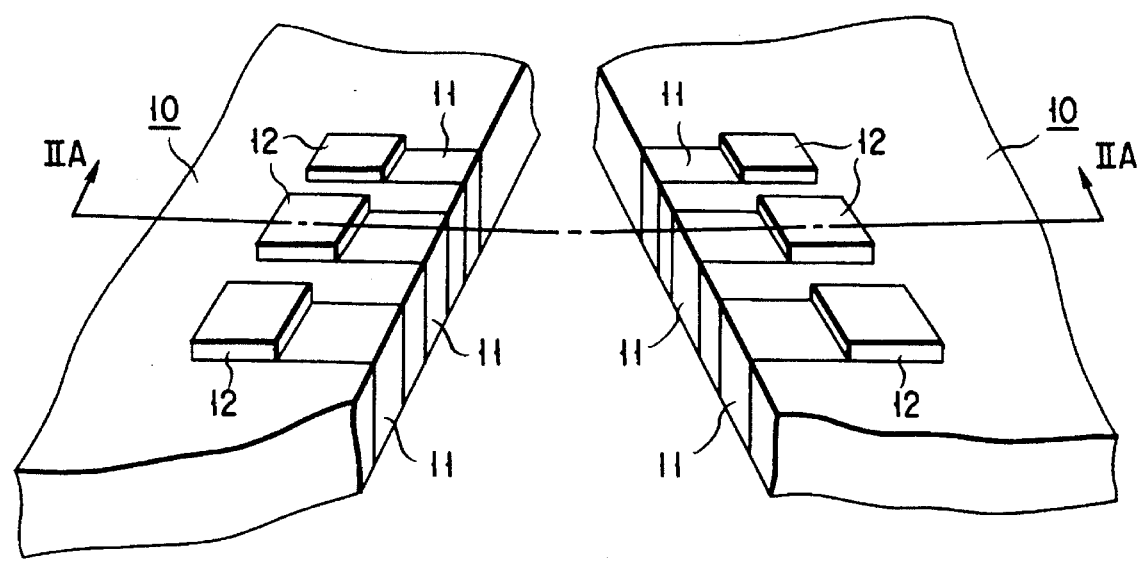
F I G. 1A
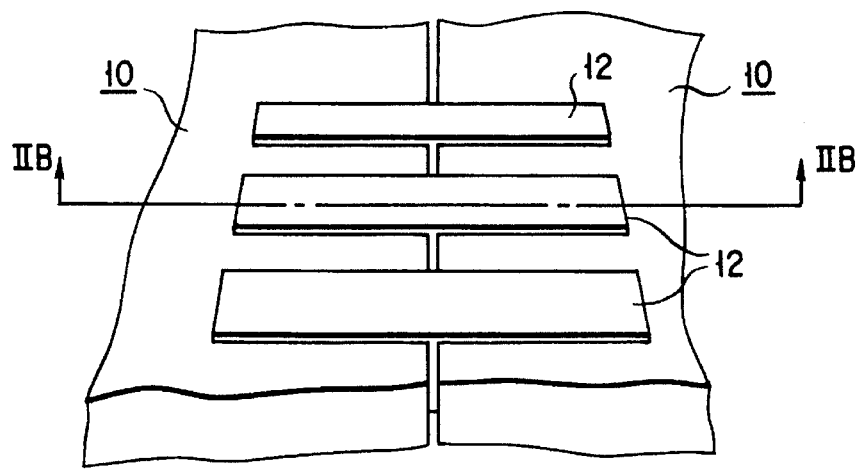
F I G. 1B

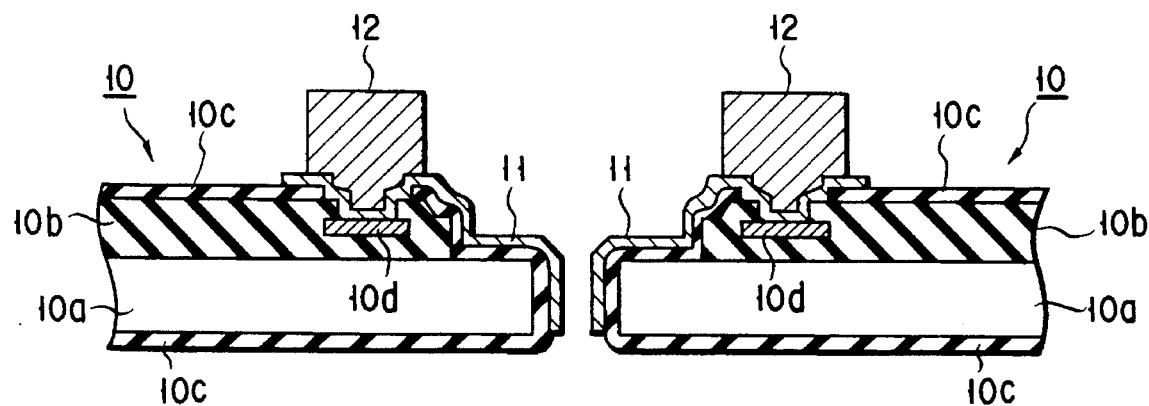
F I G. 2A
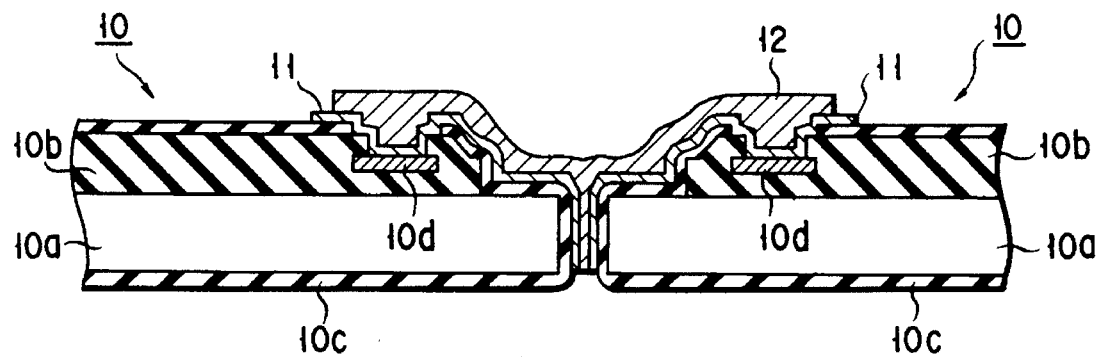
F I G. 2B

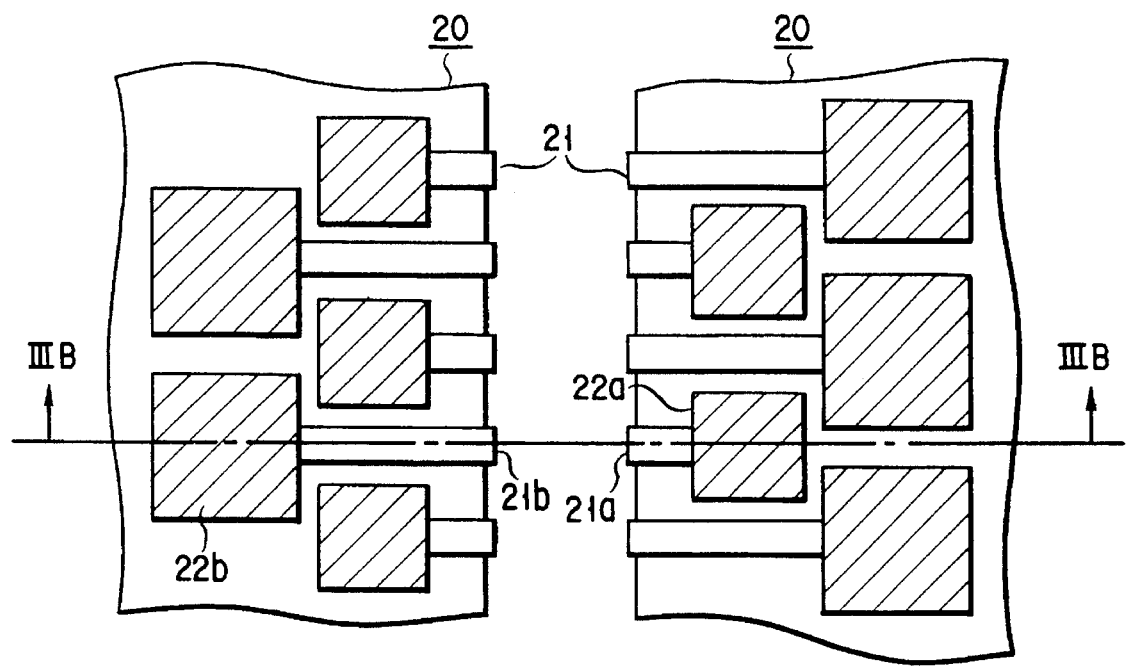
F I G. 3A
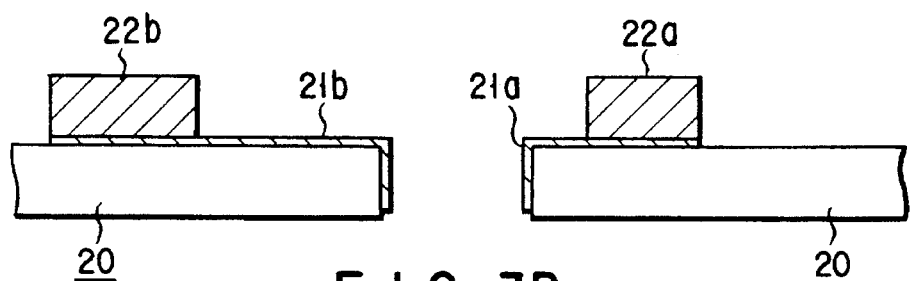
F I G. 3B
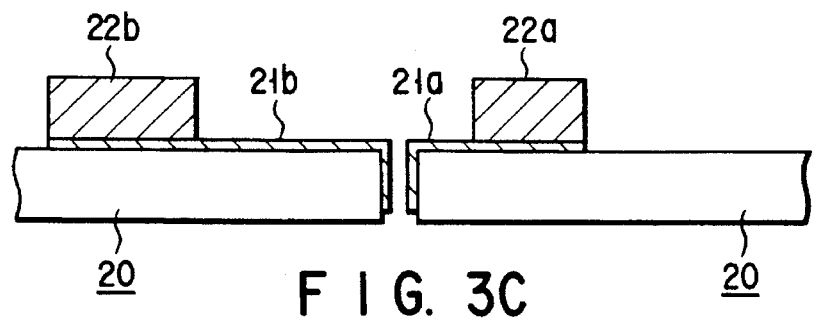
F I G. 3C
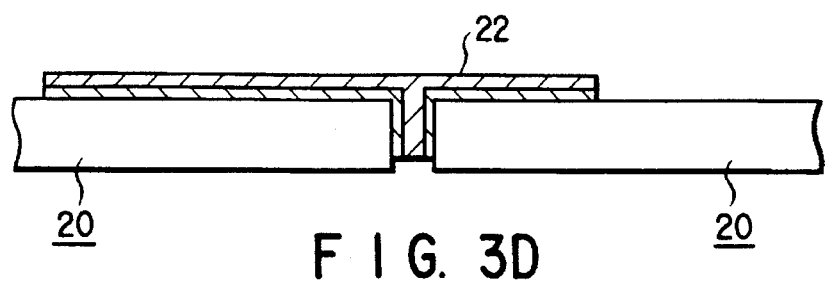
F I G. 3D

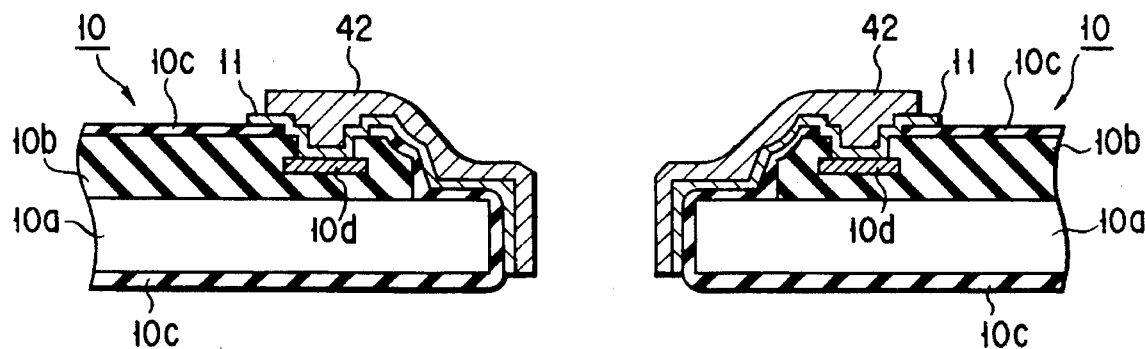
F I G. 5A
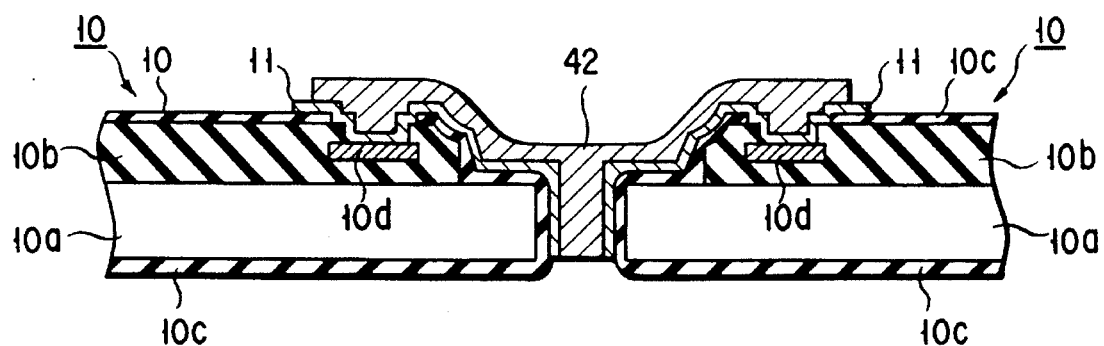
F I G. 5B

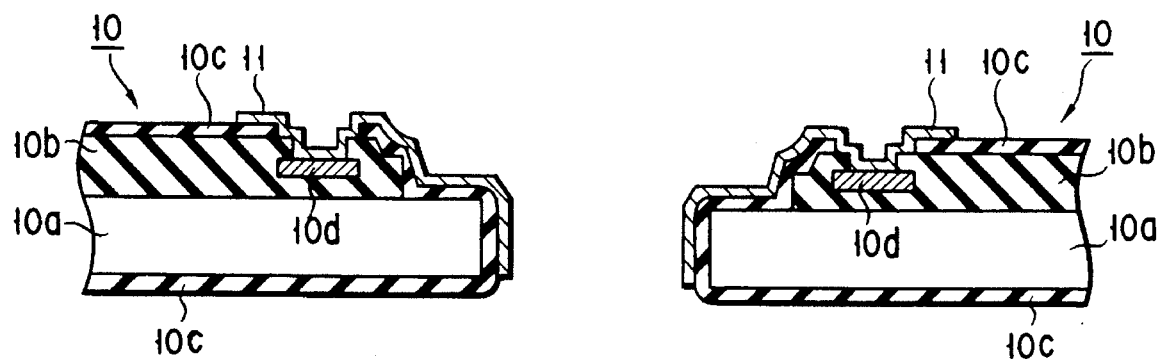
F I G. 6A
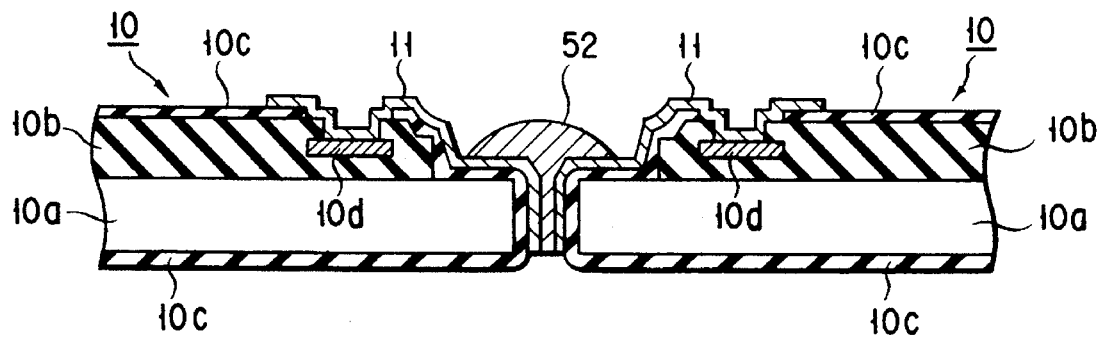
F I G. 6B
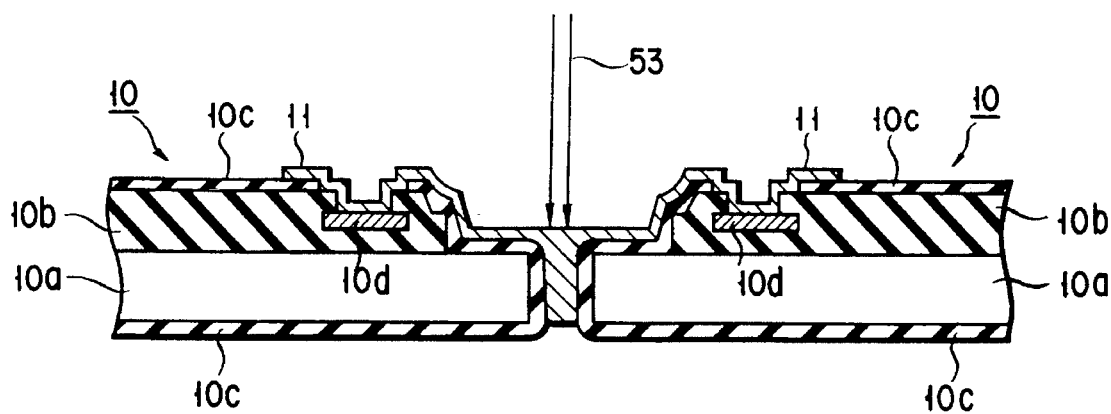
F I G. 6C

METHOD OF MANUFACTURING A SEMICONDUCTOR DEVICE

BACKGROUND OF THE INVENTION

1. Field of the Invention

The present invention relates to a method of manufacturing a semiconductor device including, for example, a plurality of semiconductor chips which are bonded to each other, particularly, to an improvement of bonding of semiconductor chips used in a high density mounting.

2. Description of the Related Art

A semiconductor device including a plurality of semiconductor chips adapted for a high density mounting and bonded to each other in a three dimensional direction is proposed in, for example, Japanese Patent Disclosure (Kokai) No. 60-241228. In this prior art, each semiconductor chip is provided with, for example, a solder bump not only on the upper surface but also on the side and lower surfaces so as to enable a plurality of chips to be bonded to each other in a three dimensional direction. However, since the solder bump is generally spherical, the adjacent chips are brought into a point-to-point contact with each other via the bump. This makes it difficult to have the chips easily and accurately aligned to each other with the result that the semiconductor device is rendered unsatisfactory in the bonding strength between adjacent chips and in the reliability of electric connection.

SUMMARY OF THE INVENTION

An object of the present invention is to provide a method of manufacturing a semiconductor device including a plurality of semiconductor chips, the method making it possible to have the chips easily and accurately aligned to each other and to improve the bonding strength between adjacent chips and the reliability of electric connection.

According to a first embodiment of the present invention, there is provided a method of manufacturing a semiconductor device including a plurality of semiconductor chips, comprising the steps of providing each chip with a connecting electrode extending from the upper surface to the side surface of the chip; and bonding the connecting electrodes of adjacent chips to each other at the upper and side surfaces of the chips.

According to a second embodiment of the present invention, there is provided a method of manufacturing a semiconductor device including a plurality of semiconductor chips, comprising the steps of providing each chip with a lead frame connected to an electrode of the chip and extending from the upper surface of the chip; bending the lead frame to extend along the side surface of the chip; and bonding the lead frames of adjacent chips to each other along the side surfaces of the chips.

In the method of the present invention, without using a projecting conductor such as a solder bump, adjacent semiconductor chips can be easily and accurately aligned to each other and the connecting electrodes or lead frames of the adjacent semiconductor chips can be strongly bonded to each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a perspective view of two semiconductor chips to be bonded to form a semiconductor device, which is an embodiment according to the present invention;

FIG. 1B is a perspective view of the semiconductor chips shown in FIG. 1A, after bonded to each other;

FIG. 2A is a cross sectional view of the two semiconductor chips shown in FIG. 1A, taken along the line IIA—IIA;

FIG. 2B is a cross sectional view of the two semiconductor chips shown in FIG. 1B, taken along the line IIB—IIB;

FIG. 3A is a plan view of two semiconductor chips to be bonded to form a semiconductor device, which is another embodiment according to the present invention;

FIG. 3B is a cross sectional view of the semiconductor chips shown in FIG. 3A, taken along the line IIIB—IIIB;

FIG. 3C is a cross sectional view of the semiconductor chips shown in FIG. 3A, in the step of aligning thereof;

FIG. 3D is a cross sectional view of the semiconductor chips shown in FIG. 3A, after bonded to each other;

FIG. 5A is a cross sectional view of two semiconductor chips to be bonded to form a semiconductor device, which is a still further embodiment according to the present invention;

FIG. 5B is a cross sectional view of the semiconductor chips shown in FIG. 5A, after bonded to each other;

FIG. 6A is a cross sectional view of two semiconductor chips to be bonded to form a semiconductor device, which is a yet further embodiment according to the present invention;

FIG. 6B is a perspective view of the semiconductor chips shown in FIG. 6A, after bonded to each other;

FIG. 6C is a cross sectional view of the semiconductor chips shown in FIG. 6A, after bonded to each other in a different manner.

DETAILED DESCRIPTION OF THE PREFERRED EMBODIMENTS

Figure 4A:
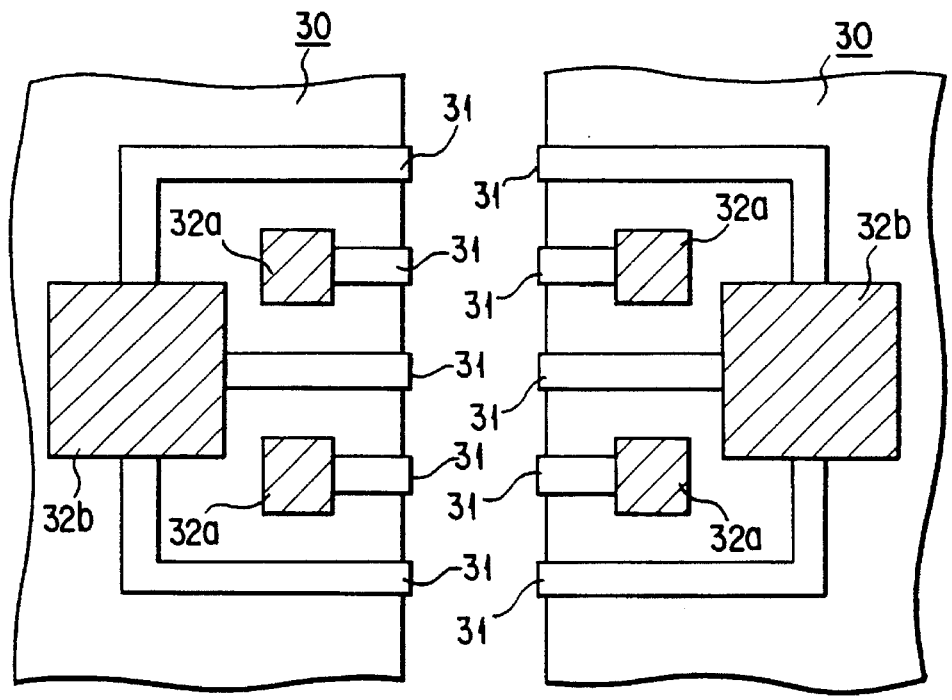
FIG. 4A is a plan view of two semiconductor chips to be bonded to form a semiconductor device, which is a further embodiment according to the present invention.

FIGS. 1A and 1B collectively show a first embodiment of the present invention. In this embodiment, two semiconductor chips 10 shown in FIG. 1A are bonded to each other to form a semiconductor device shown in FIG. 1B. As shown in FIG. 1A, each chip 10 is provided with a plurality of connecting electrodes (electrode metals) 11 such that each connecting electrode 11 extends from the upper surface to the side surface of the chip 10. A solder layer (bonding electrode) 12 shaped like a bump is formed on the connecting electrode 11 in a part of the upper surface of the chip 10. In the bonding step, the connecting electrodes 11 of one of these chips 10 are aligned with those of the other chip 10. When heated under this condition, the solder layer 12 is melted, with the result that the molten solder is supplied to the connecting electrode 11 extending from the upper surface to the side surface of the chip 10. It follows that these two semiconductor chips 10 are strongly bonded to each other.

The connecting electrode 11 is made of, for example, a flat metal wiring connected to an electrode (not shown) of a semiconductor element and extending over the surface of the chip 10. When the solder layer 12 shaped like a bump is melted, the molten solder flows along the flat metal wiring forming the connecting electrode 11, with the result that the solder is supplied onto the connecting electrode 11 extending from the upper surface to the side surface of the semiconductor chip 10.

FIGS. 2A and 2B are cross sectional views collectively showing the specific construction of the semiconductor device shown in FIGS. 1A and 1B. As shown in FIG. 2A, each semiconductor chip 10 comprises, for example, a silicon chip substrate 10a, a PSG (Phospho-Silicate Glass) film 10b, a silicon nitride film 10c and an electrode pad 10d in addition to the connecting electrode 11 and the solder layer 12, which are also shown in FIG. 1A. The connecting electrode 11 is formed to extend from the upper surface to the side surface of the semiconductor chip 10, and is connected in its upper surface portion to the electrode pad 10d exposed via an opening formed in the PSG film 10b and the silicon nitride film 10c. The solder layer 12 is formed in the shape of a bump on that portion of the connecting electrode 11 which is positioned to face the electrode pad 10d formed in the upper surface of the semiconductor chip 10. As shown in the drawings, those portions of the connecting electrodes 11 which are positioned on the side surfaces of the chips 10 are aligned with each other. Since these portions of the connecting electrodes 11 are in the shape of a flat plate, these chips 10 can be easily and accurately aligned to each other in the bonding step.

when the solder layer 12 is melted in the subsequent step, the molten solder flows over the connecting electrodes 11, with the result that the solder is supplied to the entire region of the connecting electrode 11 extending from the upper surface to the side surface of the semiconductor chip 10. It follows that the adjacent semiconductor chips 10 are bonded to each other in the entire region of the connecting electrode 11 including the upper surface region and the side surface region of the chip 10, leading to a high bonding strength.

As described above, the connecting electrode 11 is in the shape of a flat plate. Naturally, the solder permits the connecting electrodes 11 of the adjacent semiconductor chips 10 to be brought into an area-to-area contact with each other, making it possible to align easily and accurately the adjacent chips 10 to be bonded. In addition, the adjacent chips 10 can be bonded to each other strongly and with a high stability. Further, the bonded portion exhibits a high reliability in its electric connection.

FIGS. 3A to 3D cover a case where a plurality of electrode pads are arranged in a staggered fashion in each of semiconductor chips 20 to be bonded. To be more specific, FIG. 3A is a plan view showing two semiconductor chips 20 to be bonded. FIG. 3B is a cross sectional view along the line IIIB—IIIB shown in FIG. 3A. Further, FIGS. 3C and 3D show how these two chips 20 are bonded to each other.

Solder layers 22a and 22b are formed on the electrode pads (not shown) arranged in the semiconductor chip 20 in a staggered fashion. Also, connecting electrodes 21a and 21b are formed to extend from the upper surface, on which the solder layers 22a and 22b are formed, to the side surface of each semiconductor chip 20. As shown in the drawings, the connecting electrode 21a is shorter than the connecting electrode 21b. In other words, the solder layer 22a is positioned closer to an edge of the semiconductor chip 20 than the solder layer 22b. In this embodiment, the amount of the solder layer is controlled in accordance with the length of the connecting electrode to which the solder layer is connected. Specifically, the amount of the solder layer 22a connected to the short connecting electrode 21a is smaller than that of the solder layer 22b connected to the long connecting electrode 21b. Since the amount of the solder layer is controlled depending on the length of the connecting electrode, the connecting electrodes of the adjacent chips 20 can be bonded to each other with a suitable amount of the solder, with the result that the semiconductor chips 20 can be stably bonded to each other. Further, in the bonding step, the connecting electrode 21a in one of the chips 20 is aligned with the connecting electrode 21b of the other chip 20, as shown in FIG. 2C. Under this condition, the solder layers 22a and 22b are melted. As a result, the molten solder flows along the entire regions of the connecting electrodes 21a, 21b so as to permit the semiconductor chips 20 to be bonded to each other in the entire regions of the connecting electrodes 21a, 21b, as shown in FIG. 3D.

Figure 4B:
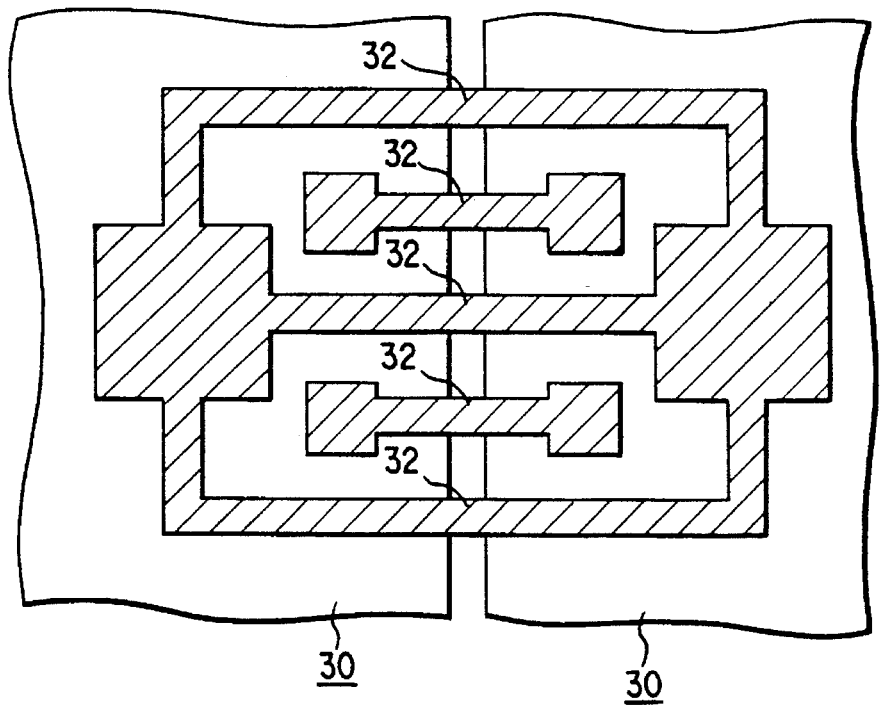
FIG. 4B is a plan view of the semiconductor chips shown in FIG. 4A, after bonded to each other.

FIGS. 4A and 4B cover a case where an electrode pad connected to a plurality of connecting electrodes 31 is formed in semiconductor chips 30 to be bonded together with electrode pads each connected to a single connecting electrode 31. In this case, a solder layer 32b is formed on the electrode pad connected to a plurality of connecting electrodes 31. Also, a solder layer 32a is formed on the electrode pad connected to a single connecting electrode 31. The amount of the solder layer is determined to conform with the length of the connecting electrode connected to said solder layer. Specifically, the amount of the solder layer 32b connected to a plurality of connecting electrodes 31 is larger than that of the solder layer 32a connected to a single connecting electrode 31.

In bonding the semiconductor chips 30 to each other, the connecting electrodes 31 in one of the two chips 30 are aligned with the connecting electrodes 31 of the other chip 30. Under this condition, the solder layers 32a, 32b are melted, with the result that the molten solder 32 flows along the entire regions of the connecting electrodes 31 so as to achieve a desired bonding, as shown in FIG. 4B.

In this embodiment, the molten solder is uniformly supplied over the entire region of each of the connecting electrodes 31 because the amount of the solder layer is determined to conform with the length of the connecting electrode connected to each solder layer, as pointed out above. Naturally, the semiconductor chips 30 are uniformly and stably bonded to each other.

In each of the embodiments described above, a solder layer shaped like a bump is melted for achieving a desired bonding. Alternatively, a connecting conductor made of a solder or other metals can be used in place of the solder layer shaped like a bump.

FIGS. 5A and 5B cover a case where a connecting conductor 42 extending from an upper surface to a side surface is formed in each of two semiconductor chips 10 to be bonded. As shown in the drawings, the semiconductor chip 10 comprises a silicon substrate 10a, a PSG film 10b, a silicon nitride film 10c, an electrode pad 10d, and an connecting electrode 11. The connecting conductor 42 is formed to cover the connecting electrode 11. In bonding these semiconductor chips 10 to each other, the connecting conductor 42 in one of these chips 10 is aligned with the connecting conductor 42 of the other chip 10. Under this condition, the connecting conductor 42 is melted, with the result that the molten conductor permits the connecting electrodes 11 of the semiconductor chips 10 to be bonded to each other in the entire region including the upper surface region and the side surface region so as to achieve a stable bonding of these chips 10, as shown in FIG. 5B.

In each of the embodiments described above, a solder layer or a connecting conductor layer is formed in advance as a connecting means on the semiconductor chips to be bonded. However, the semiconductor chips can be bonded to each other without using a solder layer or a connecting conductor layer formed in advance on the chips. For example, a connecting conductor supplied from the outside to an connecting electrode or a high energy beam can also be used as a connecting means.

FIGS. 6A to 6C collectively show cases where semiconductor chips are bonded to each other without using a solder layer or a connecting conductor layer formed in advance on the chips. Specifically, FIG. 6A shows that an connecting electrode 11 is formed to extend from an upper surface to a side surface in each of two semiconductor chips 10 to be bonded. It should be noted that a solder layer or a connecting conductor layer is not formed in the chip 10. FIG. 6B shows that the two semiconductor chips 10 are positioned close to each other such that the connecting electrode 11 in one of the two chips 10 is aligned with the connecting electrode 11 of the other chip 10. Under this condition, a connecting conductor 52 such as a molten solder is supplied from the outside into a region between the two connecting electrodes 11 so as to permit the two semiconductor chips 10 to be bonded to each other. Further, FIG. 6C shows that the connecting electrodes 11 which are aligned with each other are melted by heating with a high energy beam 53 such as a laser beam, which is used as a connecting means, so as to achieve a desired bonding. Incidentally, the semiconductor chip 10 shown in FIGS. 6A to 6C also comprises a silicon substrate 10a, a PSG film 10b, a silicon nitride film 10c, and an electrode pad 10d, as in the embodiment shown in FIGS. 5A and 5B.

FIGS. 7A to 7D collectively show another embodiment of the present invention. In this embodiment, a TAB lead 71 is used as a lead frame for bonding two adjacent semiconductor chips 70. The TAB lead 71 is bent so as to be brought into contact at one end with an upper surface and at the other end with a lower surface of the structure of the chip 70.

Figure 7A:
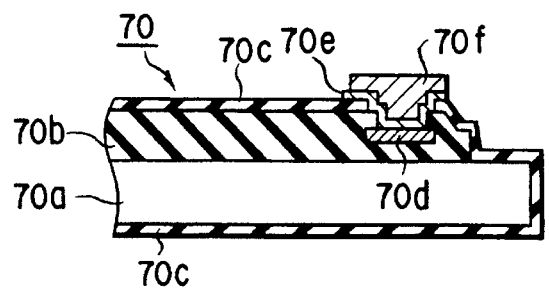
FIGS. 7A to 7D are cross sectional views of two semiconductor chips to be bonded to form a semiconductor device, which is a further embodiment according to the present invention.

As shown in FIG. 7A, the semiconductor chip 70 comprises, for example, a silicon chip substrate 70a, a PSG film 70b, a silicon nitride film 70c, an electrode pad 70d, an connecting electrode 70e, and a solder bump or gold bump 70f formed in contact with the connecting electrode 70e.

Figure 7B:
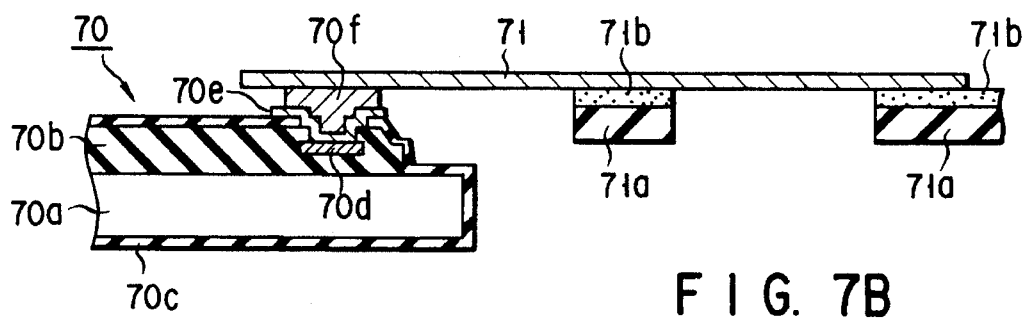
Figure 7C:
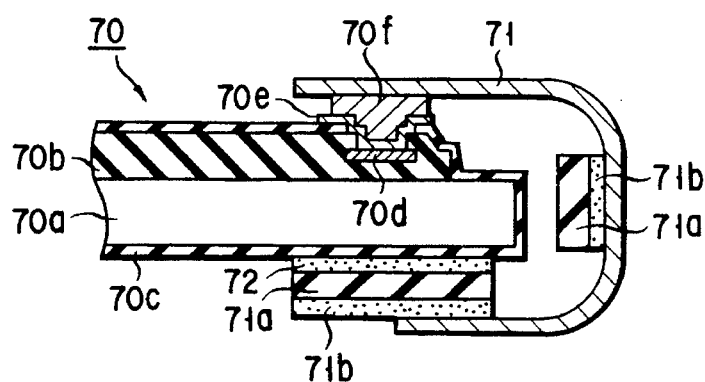
Figure 7D:
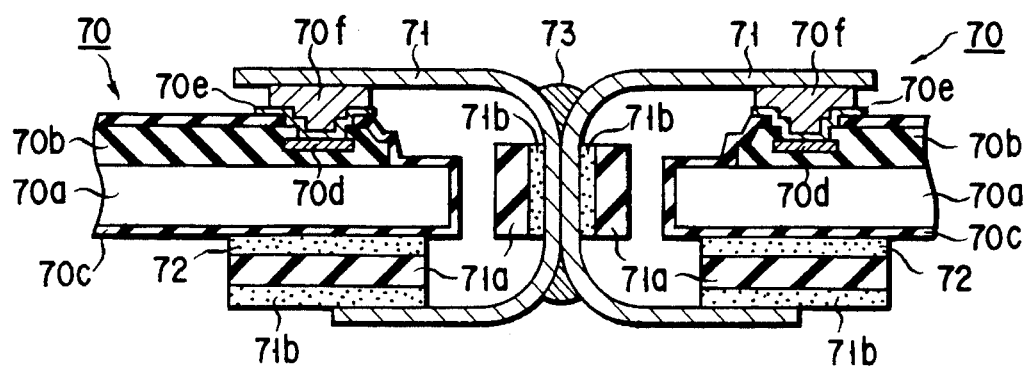

The TAB lead 71 is formed by using a laminate structure prepared by bonding a conductor layer such as a copper layer to an insulating film 71a with an adhesive layer 71b interposed therebetween. As shown in FIG. 7B, these insulating film 71a and adhesive layer 71b are selectively removed by etching, and the remaining conductor layer acting as the TAB lead 71 is connected at one end to the solder or gold bump 70f formed in the upper surface of the semiconductor chip 70. Further, the TAB lead 71 is bent to extend along the side surface of the semiconductor chip, and to permit the other end portion, where the insulating film 71a and the adhesive layer 71b are left unremoved, to be brought into contact with the lower surface of the semiconductor chip 70 with an adhesive layer 72 interposed therebetween, as shown in FIG. 7C. Two semiconductor chips 70 of the particular construction are positioned in contact with each other such that the TAB lead 71 in one of these chips 70 is aligned with the TAB lead 71 of the other chip. Under this condition, these TAB leads 71 are bonded to each other with a connecting conductor 73 such as an adhesive or a conductive paste, which is supplied from the outside, so as to achieve a desired bonding of the two semiconductor chips 70, as shown in FIG. 7D. In this embodiment, the two semiconductor chips to be bonded can be easily and accurately aligned to each other because the TAB lead 71 is flexible. In addition, the adjacent TAB leads are brought into mutual contact in a large area, leading to a high reliability of electric connection.

As described above, a plurality of semiconductor chips are easily and accurately aligned to each other and the connecting electrodes of these semiconductor chips are bonded to each other without utilizing a projecting conductor portion such as a solder bump in any of the embodiments of the present invention. To reiterate, an connecting electrode formed to extend from an upper surface to a side surface of a semiconductor chip is aligned with another connecting electrode formed in another semiconductor chip. Under this condition, these connecting electrodes are bonded to each other so as to achieve bonding of the semiconductor chips. It should be noted that the adjacent connecting electrodes are brought into an area-to-area contact with each other, making it possible to have the semiconductor chips easily and accurately aligned to each other. In addition, the chips can be strongly bonded to each other. It follows that the method of the present invention permits mutually bonding semiconductor chips with a high stability and a high bonding strength. In addition, a high reliability in electric connection can be ensured in the bonded portion.

In each of the embodiments described above, semiconductor chips are bonded to each other in only one side surface of the chip. However, it is of course possible to achieve bonding in another side surface of the chip. Further, the method can be modified in various other fashions within the technical scope of the present invention.

As described above in detail, the present invention provides a method of manufacturing a semiconductor device which permits easily and accurately aligning the semiconductor chips to be bonded to each other and also permits improving the bonding strength and reliability of electric connection in the bonded portion.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device including a plurality of semiconductor chips, comprising the steps of providing each chip with a lead frame connected to an electrode of said chip and extending from the upper surface of the chip; bending said lead frame to extend along the side surface of the chip; and bonding the lead frames of adjacent chips to each other along the side surfaces of said chips.

2. The method of manufacturing a semiconductor device according to claim 1, wherein a TAB lead is used as said lead frame.

3. A method of manufacturing a semiconductor device including a plurality of semiconductor chips, comprising the steps of:

providing each chip with a connecting electrode extending from an upper surface to a side surface of said each chip; and bonding the connecting electrodes of adjacent chips to each other at the upper surface and the side surface of said adjacent chips.

4. The method of manufacturing a semiconductor device according to claim 1, wherein a connecting conductor layer formed on said connecting electrode to extend from the upper surface to the side surface of the semiconductor chip is used in said bonding step for the mutual bonding of the connecting electrodes of adjacent semiconductor chips.

5. The method of manufacturing a semiconductor device according to claim 1, wherein a connecting conductor supplied from the outside is used in said bonding step for the mutual bonding of the connecting electrodes of adjacent semiconductor chips.

6. The method of manufacturing a semiconductor device according to claim 1, wherein connecting electrodes of adjacent semiconductor chips are melted in said bonding step for the mutual bonding of the chips.

7. The method of manufacturing a semiconductor device according to claim 1, wherein a connecting conductor layer formed on that portion of said connecting electrode which is positioned on the upper surface of said semiconductor chip is melted in said bonding step to cause the molten conductor to flow along said connecting electrode extending from the upper surface to the side surface of the chip so as to achieve mutual bonding of said connecting electrodes.

8. The method of manufacturing a semiconductor device according to claim 7, wherein said connecting conductor layer is formed for each connecting electrode.

9. The method of manufacturing a semiconductor device according to claim 8, wherein the amount of said connecting conductor layer is controlled in accordance with the length of said connecting electrode.

10. The method of manufacturing a semiconductor device according to claim 7, wherein said connecting conductor layer is commonly used for a plurality of connecting electrodes connected to each other on the upper surface of the semiconductor chip.

11. The method of manufacturing a semiconductor device according to claim 10, wherein the amount of said connecting conductor layer commonly used for a plurality of connecting electrodes is larger than that of a connecting conductor layer used exclusively for a single connecting electrode.

* * * * *